US012811609B2

(12) United States Patent
Dizdar et al.

(10) Patent No.: US 12,811,609 B2
(45) **Date of Patent: *Nov. 24, 2026**

(54) RECOVERING SCRAMBLING SEQUENCE INITIALIZATION FROM FROZEN BITS OF AN UNCODED DOWNLINK CONTROL INFORMATION VECTOR

(71) Applicant: VIAVI Solutions Inc., Chandler, AZ (US)

(72) Inventors: Onur Dizdar, London (GB); Matthew David Brown, Hants (GB); Jiancao Hou, Surbiton (GB); Chi-ming Leung, Hardwick (GB); Ata Sattarzadeh Hashemi, Guildford (GB); Yi Xien Yap, Potters Bar (GB)

(73) Assignee: VIAVI Solutions Inc., Chandler, AZ (US)

(*) Notice: Subject to any disclaimer, the term of this patent is extended or adjusted under 35 U.S.C. 154(b) by 29 days.

This patent is subject to a terminal disclaimer.

(21) Appl. No.: 18/960,776

(22) Filed: Nov. 26, 2024

(65) Prior Publication Data

US 2025/0096820 A1 Mar. 20, 2025

Related U.S. Application Data

(63) Continuation of application No. 18/128,725, filed on Mar. 30, 2023, now Pat. No. 12,199,641.

(51) Int. Cl.
*H03M 13/29* (2006.01)
*H03M 13/13* (2006.01)
*H03M 13/27* (2006.01)

(52) U.S. Cl.
CPC ....... *H03M 13/2927* (2013.01); *H03M 13/13* (2013.01); *H03M 13/2778* (2013.01)

(58) Field of Classification Search
CPC ............. H03M 13/2927; H03M 13/13; H03M 13/2778
(Continued)

(56) References Cited

U.S. PATENT DOCUMENTS

2019/0081735 A1* 3/2019 Chen .................... H03M 13/13
2019/0253213 A1 8/2019 Garlapati et al.
(Continued)

OTHER PUBLICATIONS

3rd Generation Partnership Project (3GPP), "Multiplexing and channel coding," Technical Specification, 206 Pages.
(Continued)

*Primary Examiner* — James C Kerveros
(74) *Attorney, Agent, or Firm* — Harrity & Harrity, LLP

(57) ABSTRACT

A device may receive a downlink signal from a base station and may construct a frozen decode matrix for decoding frozen bits from data of the downlink signal. The device may construct a linear feedback shift register (LFSR) generator matrix for a component of scrambling sequence seed bits and may multiply the frozen decode matrix and the LFSR generator matrix to generate a mapping matrix for mapping a value of a scrambling sequence initialization vector that initializes a scrambler to the frozen bits. The device may determine an inverse matrix of the mapping matrix and may multiply the inverse matrix and the frozen decode matrix to obtain a final matrix. The device may utilize the final matrix to recover, from the data of the downlink signal, the scrambling sequence seed bits used to initialize the component and may perform actions based on the scrambling sequence seed bits.

20 Claims, 11 Drawing Sheets

(58) Field of Classification Search
USPC .......................................................... 714/699
See application file for complete search history.

(56) References Cited

U.S. PATENT DOCUMENTS

| | | | |
|---|---|---|---|
| 2019/0268094 A1* | 8/2019 | Ge | H04L 1/0063 |
| 2020/0067529 A1 | 2/2020 | Hui et al. | |
| 2020/0235755 A1 | 7/2020 | Luo et al. | |
| 2024/0121796 A1 | 4/2024 | Nammi et al. | |
| 2024/0333313 A1 | 10/2024 | Dizdar et al. | |

OTHER PUBLICATIONS

3rd Generation Partnership Project (3GPP), "Physical Channels and Modulation," Technical Specification, 140 Pages.

Arikan, E., "Systematic Polar Coding," in IEEE Communications Letters, 2011, vol. 15 (8), pp. 860-862.

Arikan et al., "Channel Polarization: a Method for Constructing Capacity-achieving Codes for Symmetric Binary-input Memoryless Channels," IEEE Trans on Inf Theory, vol. 55 (7), 2009, 23 Pages.

Bae, J.H, et al., "An Overview of Channel Coding for 5g Nr Cellular Communications," Industrial Tech. Advances, 2019, pp. 1-14.

Des Noes, M., et al., "Blind Identification of the Uplink Scrambling Code Index of a WCDMA Transmission and Application to Femtocell Networks," IEEE International Conference on Communications (ICC), 2013, pp. 4530-4535.

Extended European Search Report for European Application No. EP24166887 dated Aug. 7, 2024, 5 pages.

Gardner, B.E., et al., "An Efficient Methodology to De-Anonymize the 5G-New Radio Physical Downlink Control Channel," ICASSP 2020—2020 IEEE International Conference on Acoustics, Speech and Signal Processing (ICASSP), 2020, pp. 2917-2921.

Goresky, M, et al., Algebraic Shift Register Sequences. Cambridge University Press, 2007, 492 Pages.

Richards, C.J., "A Detailed Analysis and Optimization of the Modified Polar Decoding RNTI Recovery Method to Track User Activity in 5G Networks," Sep. 1, 2022 (Sep. 1, 2022), pp. 1-159, XP093176713, Retrieved from the Internet: URL:https://apps.dtic.mil/sti/trecms/pdf/A D1201699.pdf [retrieved on Jun. 19, 2024].

Yedidia, J.S, et al., "Understanding Belief Propagation and Its Generalizations," Technical Report TR2001-22, Mitsubishi Electric Research Labs, Nov. 2001, 36 Pages.

* cited by examiner

RECOVERING SCRAMBLING SEQUENCE INITIALIZATION FROM FROZEN BITS OF AN UNCODED DOWNLINK CONTROL INFORMATION VECTOR

RELATED APPLICATION

This application is a continuation of U.S. patent application Ser. No. 18/128,725, filed Mar. 30, 2023, which is incorporated herein by reference in its entirety.

BACKGROUND

Accelerating decoding processes to extract valid operational information is critical to achieving ultra-reliable and low latency communications (URLLC) for a normal user equipment (UE) and/or an efficient multi-UE testing system.

SUMMARY

Some implementations described herein relate to a method. The method may include receiving a downlink signal from a base station and constructing a frozen decode matrix for decoding frozen bits from data of the downlink signal. The method may include constructing a linear feedback shift register (LFSR) generator matrix for a component of scrambling sequence seed bits and multiplying the frozen decode matrix and the LFSR generator matrix to generate a mapping matrix for mapping a value of a scrambling sequence initialization vector that initializes a scrambler to the frozen bits. The method may include determining an inverse matrix of the mapping matrix and multiplying the inverse matrix and the frozen decode matrix to obtain a final matrix. The method may include utilizing the final matrix to recover, from the data of the downlink signal, the scrambling sequence seed bits used to initialize the component and performing one or more actions based on the scrambling sequence seed bits.

Some implementations described herein relate to a device. The device may include one or more memories and one or more processors coupled to the one or more memories. The one or more processors may be configured to receive a downlink signal from a base station, wherein the downlink signal includes one of a physical broadcast channel signal or a physical downlink control channel signal. The one or more processors may be configured to construct a frozen decode matrix for decoding frozen bits from data of the downlink signal and construct an LFSR generator matrix for a component of scrambling sequence seed bits. The one or more processors may be configured to multiply the frozen decode matrix and the LFSR generator matrix to generate a mapping matrix for mapping a value of a scrambling sequence initialization vector that initializes a scrambler to the frozen bits and determine an inverse matrix of the mapping matrix. The one or more processors may be configured to multiply the inverse matrix and the frozen decode matrix to obtain a final matrix and utilize the final matrix to recover, from the data of the downlink signal, the scrambling sequence seed bits used to initialize the component. The one or more processors may be configured to perform one or more actions based on the scrambling sequence seed bits.

Some implementations described herein relate to a non-transitory computer-readable medium that stores a set of instructions. The set of instructions, when executed by one or more processors of a device, may cause the device to receive a downlink signal from a base station, wherein the downlink signal is a New Radio downlink control signal. The set of instructions, when executed by one or more processors of the device, may cause the device to construct a frozen decode matrix for decoding frozen bits from data of the downlink signal and construct an LFSR generator matrix for a component of scrambling sequence seed bits. The set of instructions, when executed by one or more processors of the device, may cause the device to multiply the frozen decode matrix and the LFSR generator matrix to generate a mapping matrix for mapping a value of a scrambling sequence initialization vector that initializes a scrambler to the frozen bits and determine an inverse matrix of the mapping matrix. The set of instructions, when executed by one or more processors of the device, may cause the device to multiply the inverse matrix and the frozen decode matrix to obtain a final matrix and utilize the final matrix to recover, from the data of the downlink signal, the scrambling sequence seed bits used to initialize the component. The set of instructions, when executed by one or more processors of the device, may cause the device to perform one or more actions based on the scrambling sequence seed bits.

DETAILED DESCRIPTION

Figure 1A:
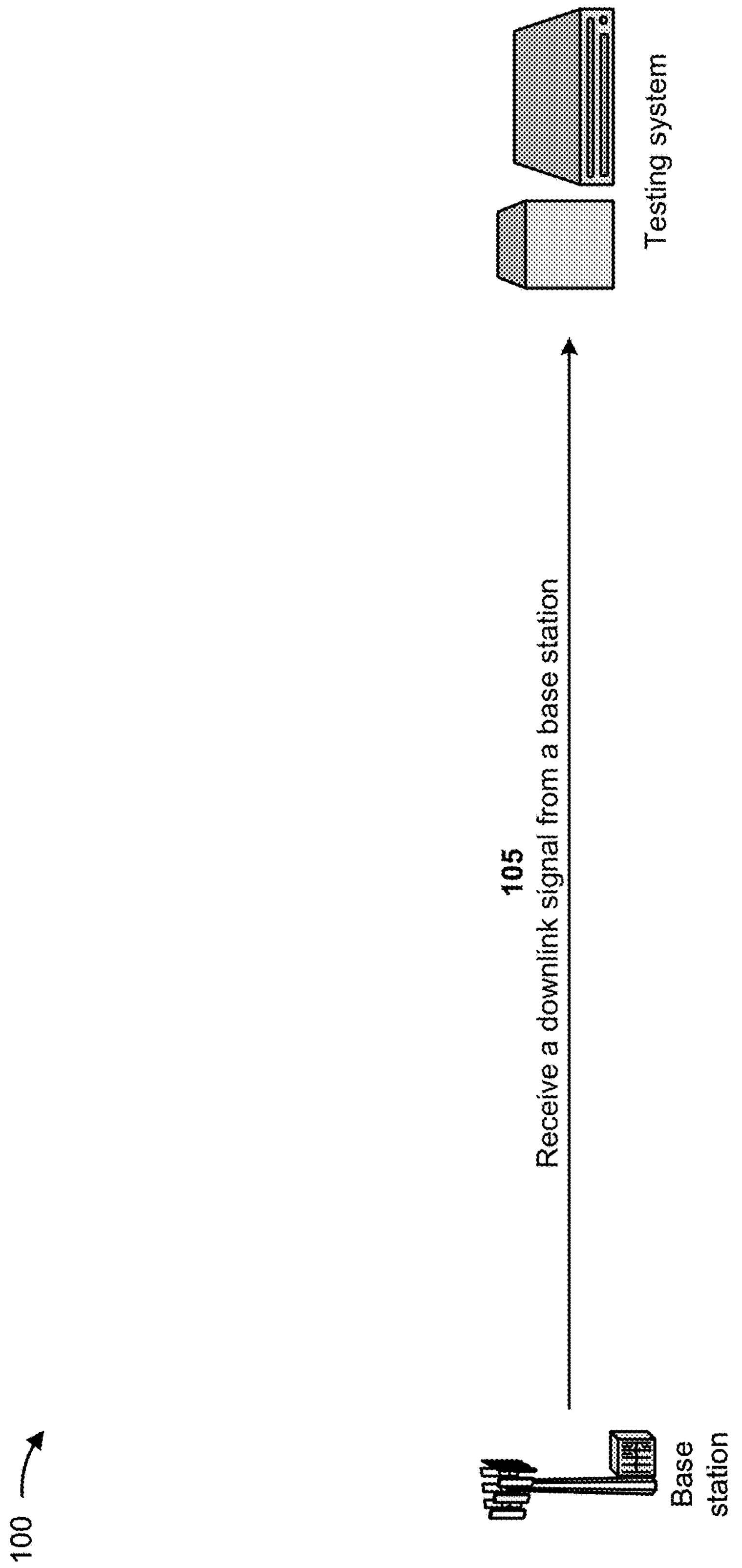
FIGS. 1A-1H are diagrams of an example implementation described herein.

The following detailed description of example implementations refers to the accompanying drawings. The same reference numbers in different drawings may identify the same or similar elements.

Decoding downlink signals (e.g., physical downlink control channel (PDCCH) signals) via blind detection is one of the most computing resource intensive and time-consuming processing tasks of a testing system. A control channel element (CCE), consisting of six resource element groups (REGs), is commonly used to carry downlink control information (DCI). Multiple CCEs (e.g., one, two, four, eight, sixteen, and/or the like) are allocated for a PDCCH candidate depending on a DCI size and channel conditions. A corresponding aggregation level (AL) is used to count a quantity of the CCEs. Although a base station may fix certain CCE indices for a particular user equipment (UE) (e.g., emulated by the testing system), the UE cannot determine exactly which set of CCEs will be used to transmit the PDCCH carrying a specific DCI format. In this case, multiple blind decoding processes are required by combining different ALs with specific starting CCE indices and DCI sizes for successful DCI decoding.

In order to process DCI before modulation, a cyclic redundancy check (CRC)-attached, radio network temporary identifier (RNTI) masked, and interleaved DCI bit vector, u∈

$$\mathbb{F}_2^N,$$

is first encoded by polar codes, where $N=2^n$ denotes a codeword length. A polar encoding operation can be expressed in a vector-matrix multiplication form. A vector $u\in$ $$\mathbb{F}_2^N$$

may denote an uncoded bit vector containing information bits and redundant bits. Indexes of information bits in the vector u may be selected from an index set $\mathcal{A}$, whereas indexes of redundant bits may be selected from an index set $\mathcal{A}^c$. With a coded bit vector $d\in$ $$\mathbb{F}_2^N,$$

the polar encoding operation can be written as:

$$d=uG,$$

where $G=F^{\otimes n}$, $$F=\begin{bmatrix}1 & 0\\ 1 & 1\end{bmatrix},$$

and $\otimes$ is a Kronecker product. With a generator matrix G that satisfies $G=G^{-1}$, an alternative representation of d can be written as:

$$d=U_{\mathcal{A}}G_{\mathcal{A}N}+U_{\mathcal{A}^c}G_{\mathcal{A}^cN},$$

where $\boldsymbol{u}_{\mathcal{A}}\in$ $$\mathbb{F}_2^K$$

and $\boldsymbol{u}_{\mathcal{A}^c}\in$ $$\mathbb{F}_2^{(N-K)}$$

are vectors composed of elements u with indexes from $\mathcal{A}$ and $\mathcal{A}^c$, respectively; and $\boldsymbol{G}_{\mathcal{A}\mathcal{N}}$ and $\boldsymbol{G}_{\mathcal{A}^c\mathcal{N}}$ are matrices composed of rows of G with indexes from $\mathcal{A}$ and $\mathcal{A}^c$, respectively, and columns of G with indexes from $\mathcal{N}=\{1, 2, \ldots, N\}$. By convention and in new radio (NR), the elements of vector $\boldsymbol{u}_{\mathcal{A}^c}$ are set to zero.

Following the encoding process, sub-block interleaving and rate matching are applied to the encoded codeword. A length of the codeword after rate-matching by E may be denoted by a vector $b\in$ $$\mathbb{F}_2^E.$$

After rate matching, the resulting vector b may be scrambled by a scrambling sequence $c\in$ $$\mathbb{F}_2^E,$$

which results in a vector $\tilde{b}\in$ $$\mathbb{F}_2^E.$$

The scrambling operation may be performed as:

$$\tilde{b}_i=b_i+c_i,$$

where $\tilde{b}_i$, $b_i$, $c_i\in\mathbb{F}_2$ and the addition is defined in $\mathbb{F}_2$. The scrambling sequence c may be defined as:

$$c_i=x_{1,i+N_c}+x_{2,i+N_c},$$

$$x_{1,i+31}=x_{1,i+3}+x_{1,i},$$

$$x_{2,i+31}=x_{2,i+3}+x_{2,i+2}+x_{2,i+1}+x_{2,i},$$

where $N_c=1600$. The sequence $x_1$ may be initialized by $x_{1,0}=1$, $x_{1,i}=0$, and $i=1, 2, \ldots, 30$. The sequence $x_2$ may be initialized by $$c_{init}=\sum_{i=0}^{30}x_{2,i}2^i,$$

where:

$$c_{init}=\left(n_{RNTI}\cdot 2^{16}+n_{ID}\right)_{mod\,2^{31}}.$$

The parameter $n_{ID}\in\{0, 1, \ldots, 65535\}$ equals a parameter pdcch-DMRS-ScramblingID if configured, and $n_{RNTI}$ is equal to a cell RNTI (C-RNTI) if a parameter pdcch-DMRS-ScramblingID is configured. In scenarios where the RNTI or initialization vector is unknown, a descrambling operation may be skipped during the detection process. This may alter the decoded data but may enable performance of a single decoding operation instead of 65,536 decoding operations. One approach to recover a scrambling sequence initialization vector from specific bits of uncoded DCI without a descrambling operation is to use an exhaustive search, where candidate vectors for each possible initialization vector are generated and the candidate vector, with bits that match frozen bits of an uncoded DCI vector, is selected. However, such an approach becomes infeasible for large initialization vectors.

Therefore, current techniques for providing multi-UE testing of a base station consume computing resources (e.g., processing resources, memory resources, communication resources, and/or the like), networking resources, and/or the like associated with performing unnecessary and computationally intensive decoding operations, performing an unnecessary descrambling operation, performing an exhaustive search for a scrambling sequence initialization vector, and/or the like.

Some implementations described herein relate to a testing system that recovers scrambling sequence initialization from frozen bits of an uncoded DCI vector. For example, the testing system may receive a downlink signal from a base station and may construct a frozen decode matrix for decoding frozen bits from data of the downlink signal. The testing system may construct a linear feedback shift register (LFSR) generator matrix for a component of scrambling sequence seed bits and may multiply the frozen decode matrix and the LFSR generator matrix to generate a mapping matrix for mapping a value of a scrambling sequence initialization vector that initializes a scrambler to the frozen bits. The testing system may determine an inverse matrix of the mapping matrix and may multiply the inverse matrix and the frozen decode matrix to obtain a final matrix. The testing system may utilize the final matrix to recover, from the data of the downlink signal, the scrambling sequence seed bits used to initialize the component and may perform one or more actions based on the scrambling sequence seed bits.

In this way, the testing system recovers scrambling sequence initialization from frozen bits of an uncoded DCI vector, without performing a descrambling operation. For example, the testing system may determine a scrambling sequence initialization vector from specific bits of an uncoded DCI vector without performing a descrambling operation and without using an exhaustive search. The testing system may be utilized with a high signal-to-noise ratio (SNR), where bit values at specific bit locations of the uncoded DCI vector without descrambling are known. This, in turn, conserves computing resources, networking resources, and/or the like that would otherwise have been consumed in performing unnecessary and computationally intensive decoding operations, performing an unnecessary descrambling operation, performing an exhaustive search for a scrambling sequence initialization vector, and/or the like.

FIGS. 1A-1H are diagrams of an example 100 associated with recovering scrambling sequence initialization from frozen bits of an uncoded DCI vector. As shown in FIGS. 1A-1H, example 100 includes a base station associated with a testing system. The testing system may recover scrambling sequence initialization from frozen bits of an uncoded DCI vector. Further details of the base station and the testing system are provided elsewhere herein.

As shown in FIG. 1A, and by reference number 105, the testing system may receive a downlink signal from the base station. For example, the base station may generate the downlink signal. The downlink signal may include a physical broadcast channel signal (PBCH), a PDCCH signal, and/or the like. The downlink signal may include an uncoded DCI vector. The downlink signal may include a signal on a physical channel that carries DCI, and may include data identifying a number of the symbols (L), transport format, resource allocation, an uplink (UL) scheduling assignment (e.g., a UL grant), scheduling assignments, and/or other control information. The base station may provide the downlink signal to the testing system, and the testing system may receive the downlink signal from the base station. In some implementations, the testing system may continuously receive multiple downlink signals from the base station, may periodically receive multiple downlink signals from the base station, may receive multiple downlink signals from the base station based on providing requests for the downlink signals to the base station, and/or the like.

Figure 1B:
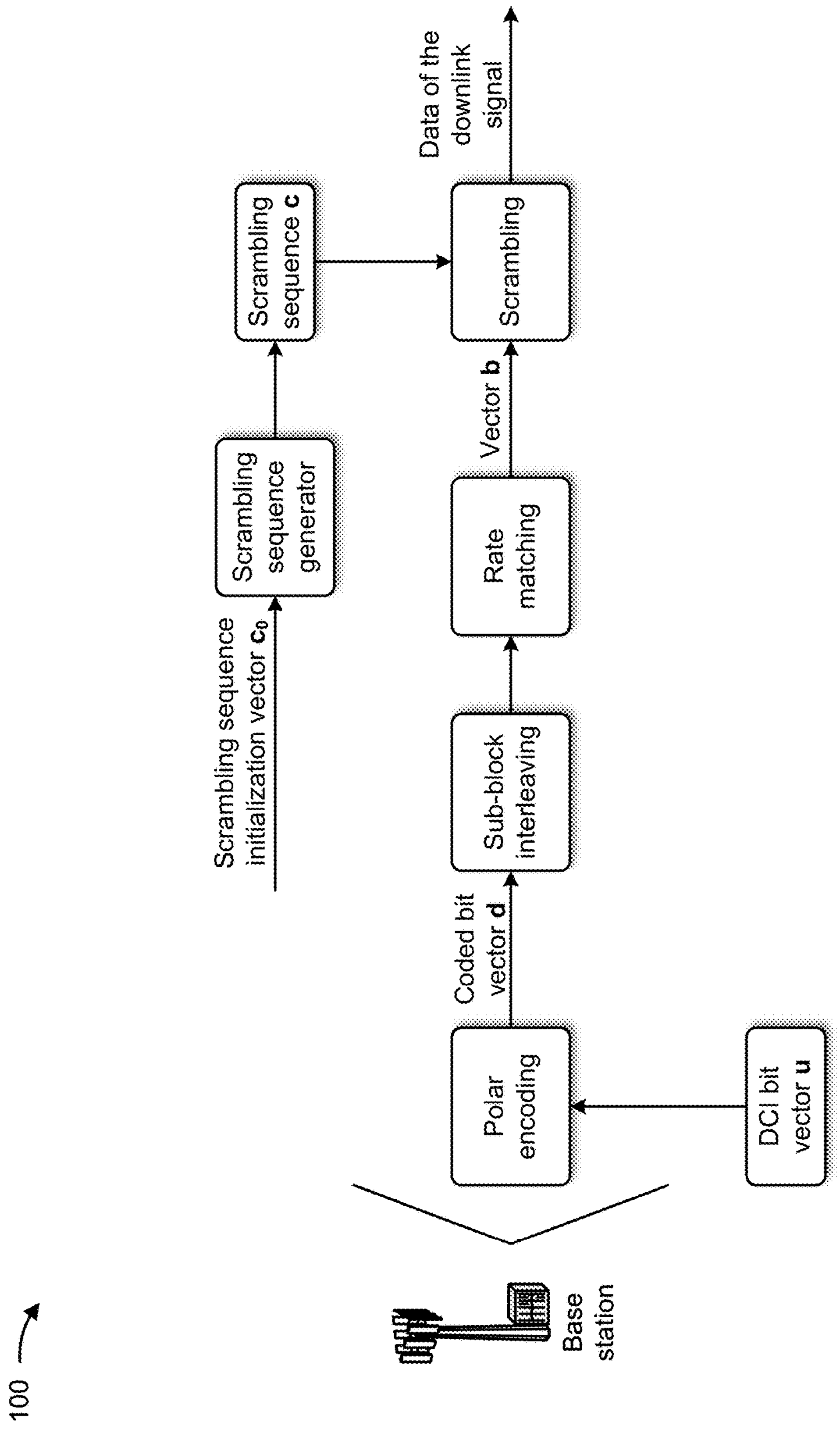

As shown in FIG. 1B, in order to process DCI before modulation, the base station may encode a CRC-attached, RNTI masked, and interleaved DCI bit vector, u∈

$$\mathbb{F}_2^N,$$

by polar codes, where $N=2^n$ denotes a codeword length. A polar encoding operation can be expressed in a vector-matrix multiplication form. A vector u∈

$$\mathbb{F}_2^N$$

may denote an uncoded bit vector containing information bits and redundant bits. Indexes of information bits in the vector u may be selected from an index set $\mathcal{A}$, whereas indexes of redundant bits may be selected from an index set $\mathcal{A}^c$. With a coded bit vector d∈

$$\mathbb{F}_2^N,$$

the polar encoding operation of the base station may be determined as:

$$d=uG,$$

where $G=F^{\otimes n}$, $$F=\begin{bmatrix}1&0\\1&1\end{bmatrix},$$

and ⊗ is a Kronecker product. With a generator matrix G that satisfies $G=G^{-1}$, an alternative representation of d can be written as:

$$d=U_{\mathcal{A}}G_{\mathcal{A}\mathcal{N}}+U_{\mathcal{A}^c}G_{\mathcal{A}^c\mathcal{N}},$$

where $\boldsymbol{u}_{\mathcal{A}}\in$ $$\mathbb{F}_2^K$$

and $\boldsymbol{u}_{\mathcal{A}^c}\in$ $$\mathbb{F}_2^{(N-K)}$$

are vectors composed of elements u with indexes from $\mathcal{A}$ and $\mathcal{A}^c$, respectively; and $\boldsymbol{G}_{\mathcal{A}\mathcal{N}}$ and $\boldsymbol{G}_{\mathcal{A}^c\mathcal{N}}$ are matrices composed of rows of G with indexes from $\mathcal{A}$ and $\mathcal{A}^c$, respectively, and columns of G with indexes from $\mathcal{N}=\{1, 2, \ldots, N\}$. By convention and in NR, the elements of vector $\boldsymbol{u}_{\mathcal{A}^c}$ are set to zero.

Following the encoding process, the base station may apply sub-block interleaving and rate matching to the encoded codeword. A length of the codeword after rate-matching by E may be denoted by a vector b∈

$$\mathbb{F}_2^E.$$

After rate matching, the base station may scramble the resulting vector b with a scrambling sequence c∈

$$\mathbb{F}_2^E,$$

which results in a vector $\tilde{b}$∈

$$\mathbb{F}_2^E.$$

The base station may perform scrambling operation as follows:

$$\tilde{b}_i = b_i + c_i,$$

where $\tilde{b}_i$, $b_i$, $c_i \in \mathbb{F}_2$ and the addition is defined in $\mathbb{F}_2$. The scrambling sequence c may be defined as:

$$c_i = x_{1,i+N_c} + x_{2,i+N_c},$$

$$x_{1,i+31} = x_{1,i+3} + x_{1,i},$$

$$x_{2,i+31} = x_{2,i+3} + x_{2,i+2} + x_{2,i+1} + x_{2,i},$$

where $N_c$=1600. The sequence $x_1$ may be initialized by $x_{1,0}$=1, $x_{1,i}$=0, and i=1, 2, . . . , 30. The sequence $x_2$ may be initialized by $$c_{init} = \sum_{i=0}^{30} x_{2,i} 2^i,$$

where:

$$c_{init} = \left(n_{RNTI} \cdot 2^{16} + n_{ID}\right)_{mod 2^{31}}.$$

The parameter $n_{ID} \in \{0, 1, \ldots, 65535\}$ equals a parameter pdcch-DMRS-ScramblingID if configured, and $n_{RNTI}$ is equal to a C-RNTI if a parameter pdcch-DMRS-ScramblingID is configured. The scrambling operation may generate an uncoded DCI vector (q) of the downlink signal.

Figure 1C:
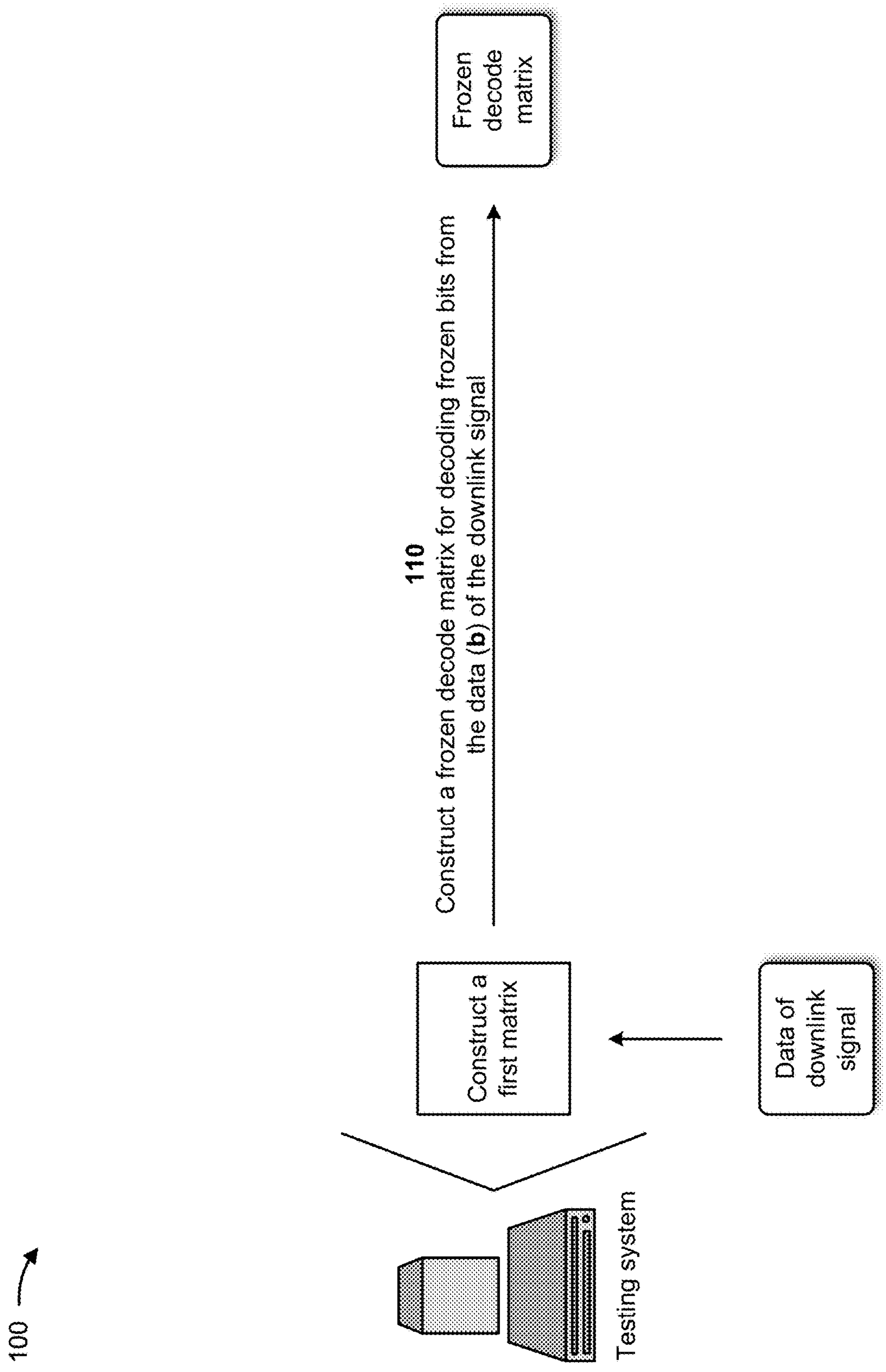

As shown in FIG. 1C, and by reference number 110, the testing system may construct a frozen decode matrix for decoding frozen bits from data (b) of the downlink signal. For example, the testing system may recover seed bits ($c_{init}$) from the data (b) of the downlink signal based on the following calculation:

$$c_{init} = \left(\tilde{b} X_2^{MATRIX}\right) + x_1^{mask} \tag{1}$$

where $$x_1^{mask} \in \mathbb{F}_2^{31} \text{ and } x_1^{mask}$$

∈ is a vector that is added to a result of the matrix multiplication to remove an effect of $x_1$ from the result.

$$X_2^{MATRIX}$$

is a matrix used to recover the seed bits $c_{init}$ for $x_2$. In some implementations, $$X_2^{MATRIX}$$

may include E columns and thirty one (31) rows, where each column may be ∈

$$\mathbb{F}_2^{31}.$$

The testing system may generate the $x_1$ sequence using a fixed seed of one. Therefore, the testing system may determine the $$x_1^{mask}$$

as follows:

$$x_1^{mask} = x_1 X_2^{MATRIX} \tag{2}$$

It may be equally valid to remove the effect of $x_1$ before the matrix multiplication as follows:

$$c_{init} = \left(\tilde{b} + x_1\right) X_2^{MATRIX} \tag{3}$$

The testing system may generate $$X_2^{MATRIX}$$

by constructing a frozen decode matrix that can be used to decode the frozen bits ($q_{\mathcal{A}^c}$) from the unscrambled data (b) of the downlink signal.

To create the frozen decode matrix, the testing may generate an input-output relation (r) of a polar encoder as follows:

$$r = qG. \tag{4}$$

If as relation $G=G^{-1}$ exists, the testing system may rewrite equation (4) as follows:

$$q=rG. \tag{5}$$

The testing system may define a sub-block interleaver represented by a matrix D of dimensions N×N, which performs an interleaving operation to obtain an interleaved vector r' as follows:

$$r'=rD. \tag{6}$$

The testing system may utilize the relation, $D^{-1}=D^{T}$, to calculate a corresponding de-interleaving operation as:

$$r=r'D^{T}. \tag{7}$$

The testing system may express the interleaved vector r' in terms of the scrambling sequence s as:

$$r'_i=\begin{cases}0, & \text{if } i\in\mathcal{N}\backslash\varepsilon,\\ b_{i-k}, & \text{if } i\in\varepsilon,\end{cases} \tag{8}$$

where $\varepsilon=\{k, k+1, \ldots, k+E'-1\}$. The variable k may depend on the variables E, N and a rate-matching scheme, and may be expressed as:

$$k=\begin{cases}0, & \text{if } E\geq N,\\ 0, & \text{if } E<N \text{ and shortening is used,}\\ N-E, & \text{if } E<N \text{ and puncturing is used.}\end{cases} \tag{9}$$

Consequently, the testing system may define relations between the input-output relation r the unscrambled data (b) as:

$$b=r\boldsymbol{D}_{\mathcal{N}\varepsilon}, \tag{10}$$

$$r=b(D^{T})_{\varepsilon\mathcal{N}}. \tag{11}$$

The testing system may substitute equation (11) into equation (5) to obtain:

$$q=b(D^{T})_{\varepsilon\mathcal{N}}G. \tag{12}$$

which is a matrix that decodes all frozen bits and non-frozen bits. To get only the frozen bits $\boldsymbol{q}_{\mathcal{A}^c}$, the testing system may select $\mathcal{A}^c$ columns of the matrix:

$$\boldsymbol{q}_{\mathcal{A}^c}=b(D^{T})_{\varepsilon\mathcal{N}}\boldsymbol{G}_{\mathcal{N},\mathcal{A}^c} \tag{13}$$

The testing system may calculate the frozen decode matrix (Z) as follows:

$$Z=(D^{T})_{\varepsilon\mathcal{N}}\boldsymbol{G}_{\mathcal{N},\mathcal{A}^c}. \tag{14}$$

Figure 1D:
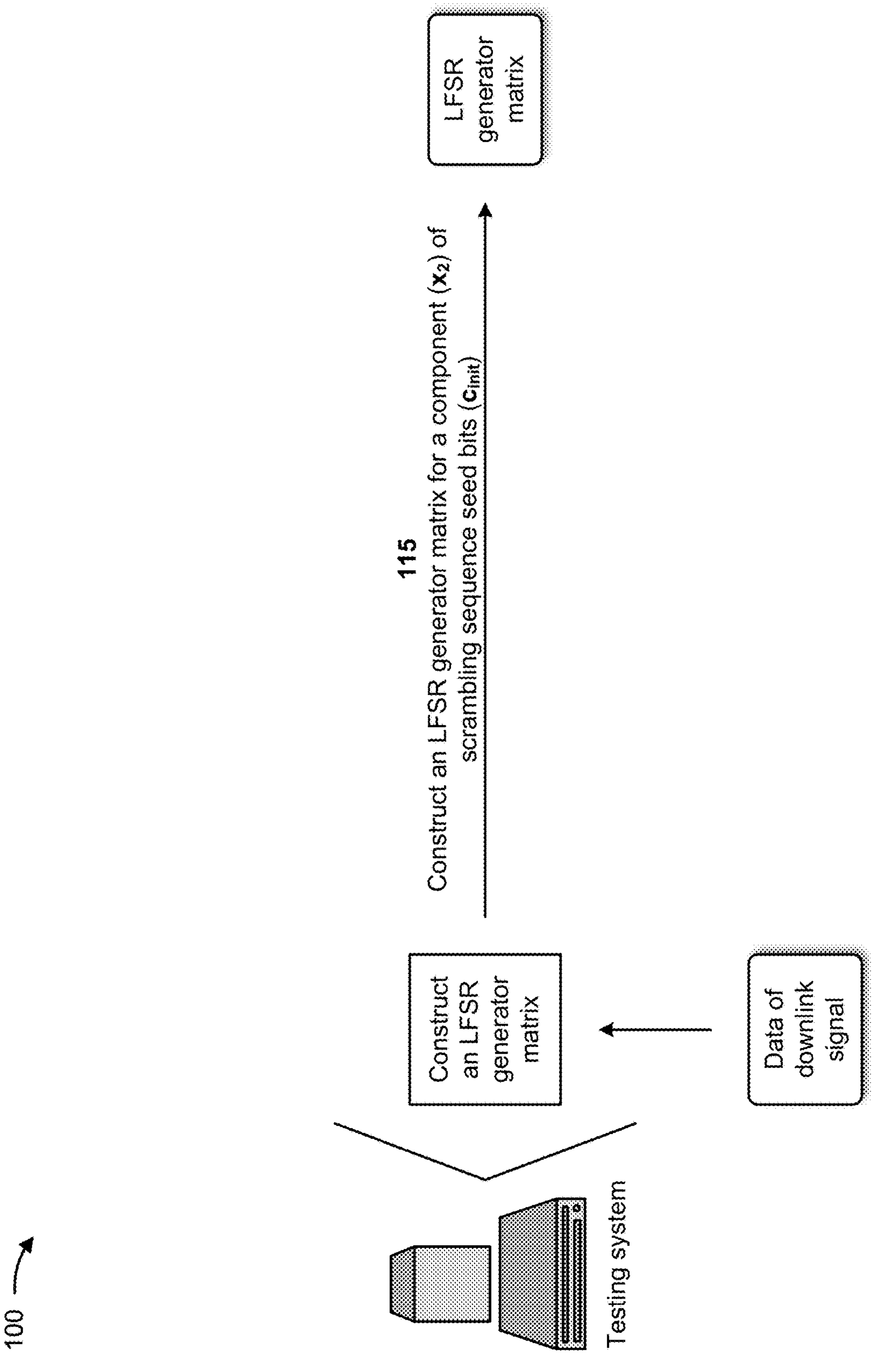

As shown in FIG. 1D, and by reference number 115, the testing system may construct an LFSR generator matrix for a component ($x_2$) of scrambling sequence seed bits ($c_{init}$). For example, the testing system may construct the LFSR generator matrix for the component ($x_2$) of the scrambling sequence seed bits ($c_{init}$) as follows. The testing system may express the sequence generation operation in vector-matrix multiplication form as follows:

$$c_{i+M}=\sum\nolimits_{k=i}^{i+M-1}p_{k-i}c_k,$$

where $p_0, \ldots, p_{M-1}\in\{0,1\}$ are a coefficients of a generator polynomial. The testing system may calculate the generation of the first sequence bit, $c_M$, from an initial bit sequence, $c_0=[c_0 \ldots c_{M-1}]$, in vector-matrix multiplication form as:

$$[c_1 \ \ldots \ c_M]=c_1=c_0C, \tag{15}$$

where $$C=\begin{bmatrix}0 & 0 & \cdots & 0 & p_0\\ 1 & 0 & \cdots & 0 & p_1\\ 0 & 1 & \cdots & \vdots & p_2\\ \vdots & \vdots & \ddots & 0 & \vdots\\ 0 & \cdots & 0 & 1 & p_{M-1}\end{bmatrix}\in\mathbb{F}_2^{MxM}.$$

C may be invertible if $p_0=1$. If $c_j=[c_j \ldots c_{j+M-1}]$, then, the testing system may express $c_j$ in terms of $c_0$ as:

$$c_j=c_0C^{j}. \tag{16}$$

As described above, the LFSR sequences $x_1$ and $x_2$ may be offset $N_c$ bits. Therefore, the testing system may define the LFSR generator matrix to generate the sequence for E bits of the downlink signal as follows:

$$\tilde{C}=\left[C^{N_c}C^{N_c+M}C^{N_c+2M} \ \ldots \ C_{M,E}^{N_c+\lceil E/M\rceil}\right]. \tag{17}$$

Figure 1E:
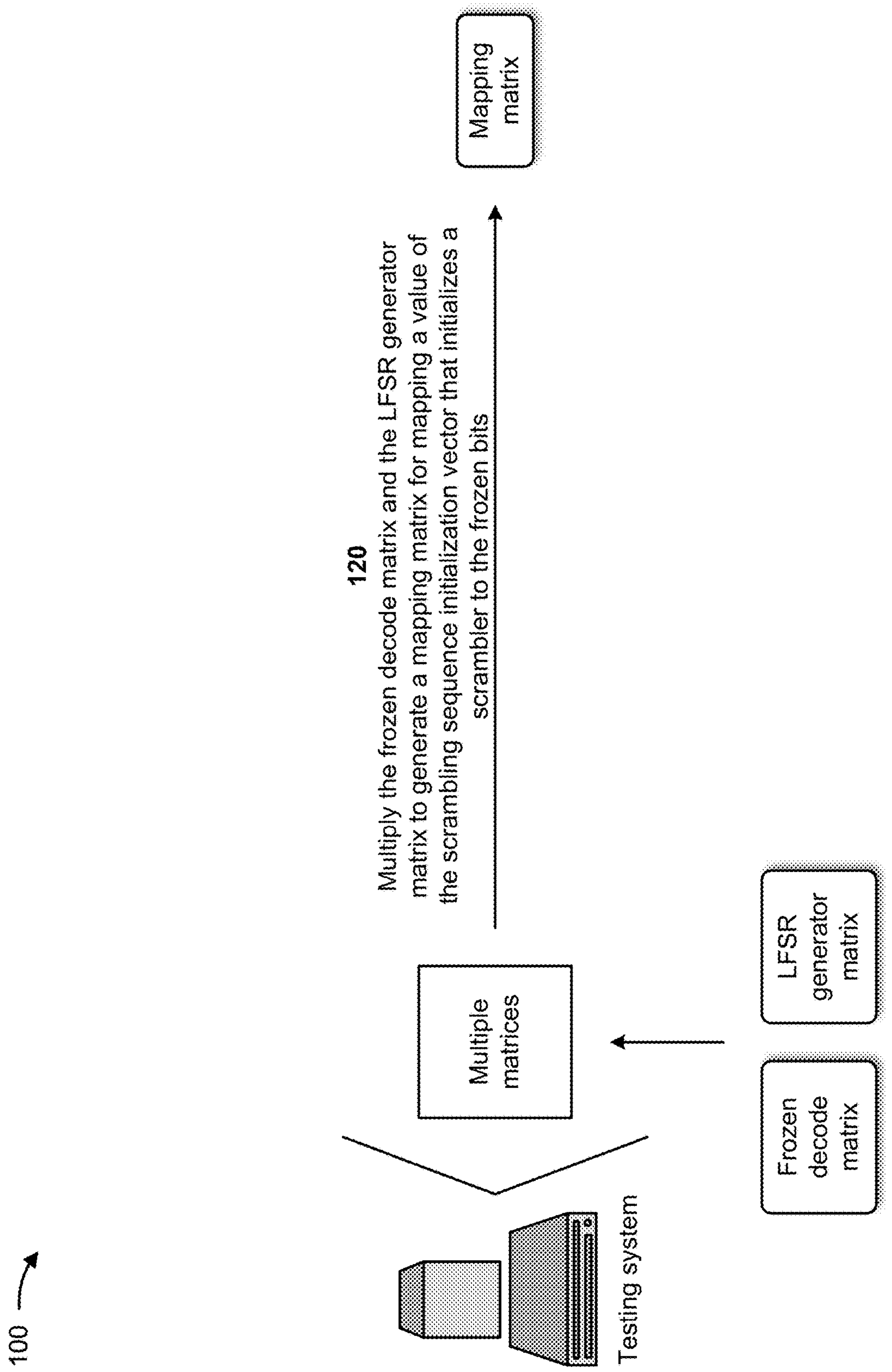

As shown in FIG. 1E, and by reference number 120, the testing system may multiply the frozen decode matrix and the LFSR generator matrix to generate a mapping matrix for mapping a value of the scrambling sequence initialization vector that initializes a scrambler to the frozen bits. For example, the testing system may multiply the frozen decode matrix (Z) and the LFSR generator matrix ($\tilde{C}$) to generate a mapping matrix. In some implementations and assuming $x_1$ is removed, the mapping matrix may map a value of the scrambling sequence initialization vector ($c_{init}$) that initializes a scrambler to the frozen bits ($\boldsymbol{q}_{\mathcal{A}^c}$).

Figure 1F:
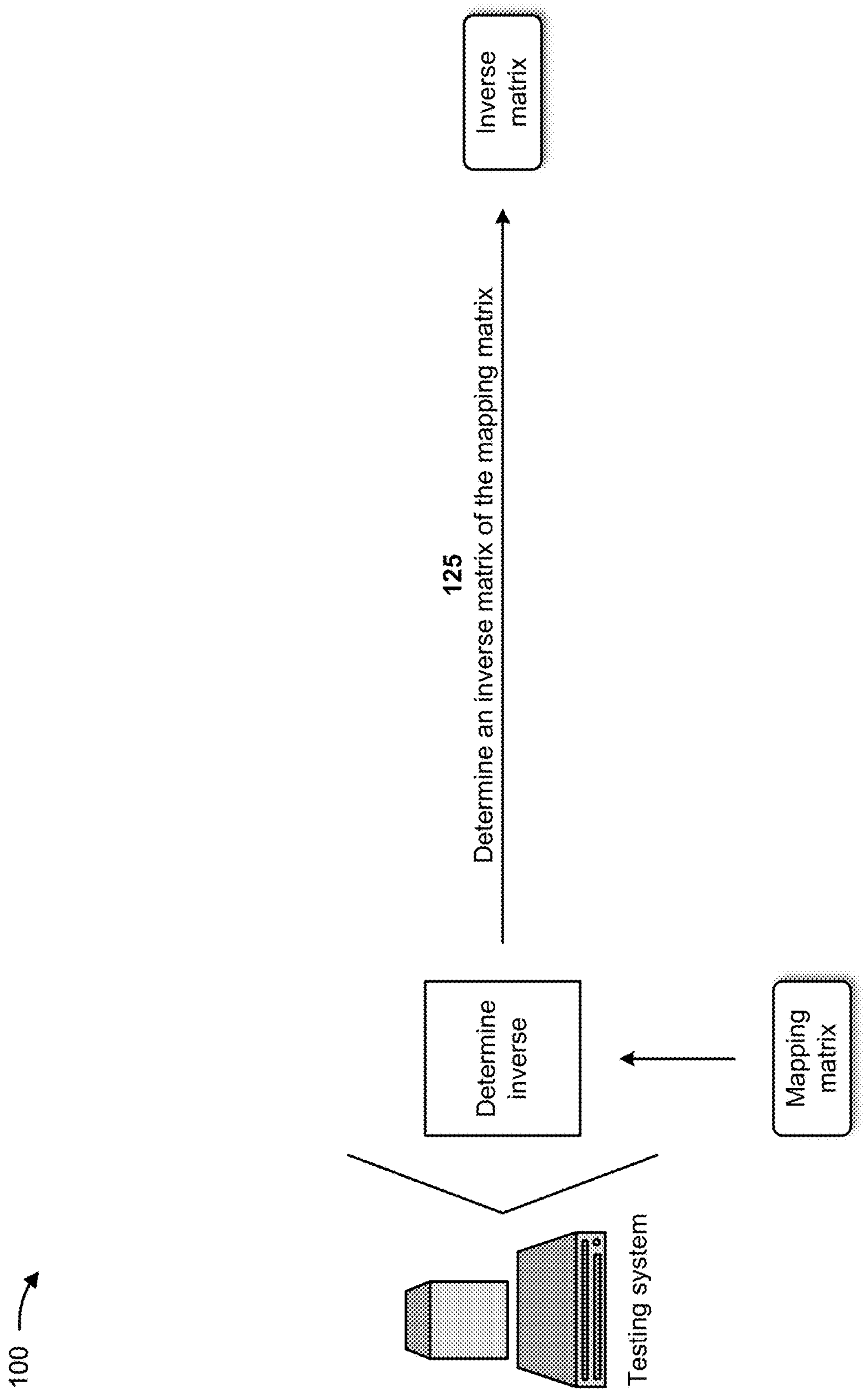

As shown in FIG. 1F, and by reference number 125, the testing system may determine an inverse matrix of the mapping matrix. For example, the testing system may determine a generalized inverse matrix of the mapping matrix. The inverse matrix may be utilized to recover the scrambling sequence seed bits ($c_{init}$) used to initialize $x_2$, assuming $x_1$ is removed. The testing system may determine the inverse matrix ($\tilde{Z}$) as follows:

$$\tilde{Z} = Z\tilde{C}, \tag{18}$$

based on the frozen decode matrix (Z) and the LFSR generator matrix ($\tilde{C}$). In some implementations, the inverse matrix ($\tilde{Z}$) may be determined based on the following definitions: $\tilde{Z}^T$ is a transpose of $\tilde{Z}$, M is a width $\tilde{Z}^T$ (e.g., a quantity of columns in $\tilde{Z}^T$), E is a height of $\tilde{Z}^T$ (e.g., a quantity of rows in $\tilde{Z}^T$), I is an E by E identity matrix, and $\tilde{Z}^{-1}$ is a generalized inverse of $\tilde{Z}$. Based on these definitions, the testing system may determine the inverse matrix ($\tilde{Z}$) by placing [$\tilde{Z}^T$ I] in a reduced row echelon form using only $$\mathbb{F}_2^{MxM}$$

operations and storing a result in a matrix V. If a sub matrix formed from the first M rows and M columns of matrix V is an identity, then a generalized inverse for $\tilde{Z}^T$ can be obtained. The testing system may determine $(\tilde{Z}^T)^{-1}$ by taking the last E columns of the first M rows of the matrix V, and may determine the inverse matrix ($\tilde{Z}$) by taking the transpose of $(\tilde{Z}^T)^{-1}$.

Figure 1G:
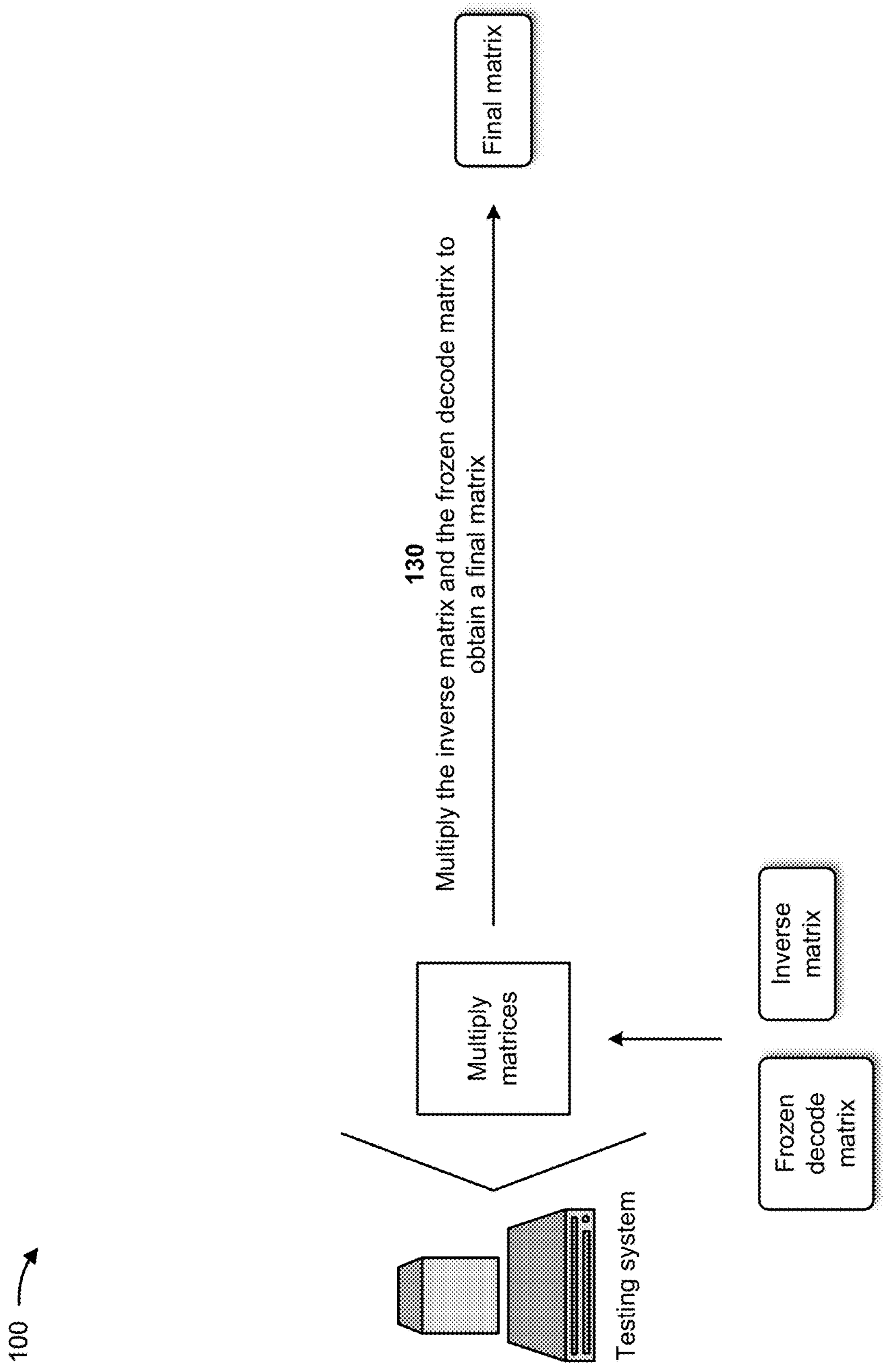

As shown in FIG. 1G, and by reference number 130, the testing system may multiply the inverse matrix and the frozen decode matrix to obtain a final matrix. For example, the testing system may multiply the inverse matrix ($\tilde{Z}$) and the frozen decode matrix (Z) to obtain the final matrix. The final matrix may recover the scrambling sequence seed bits ($c_{init}$) used to initialize the component $x_2$ from the scrambled data b of the downlink signal (e.g., assuming $x_1$ is removed).

Figure 1H:
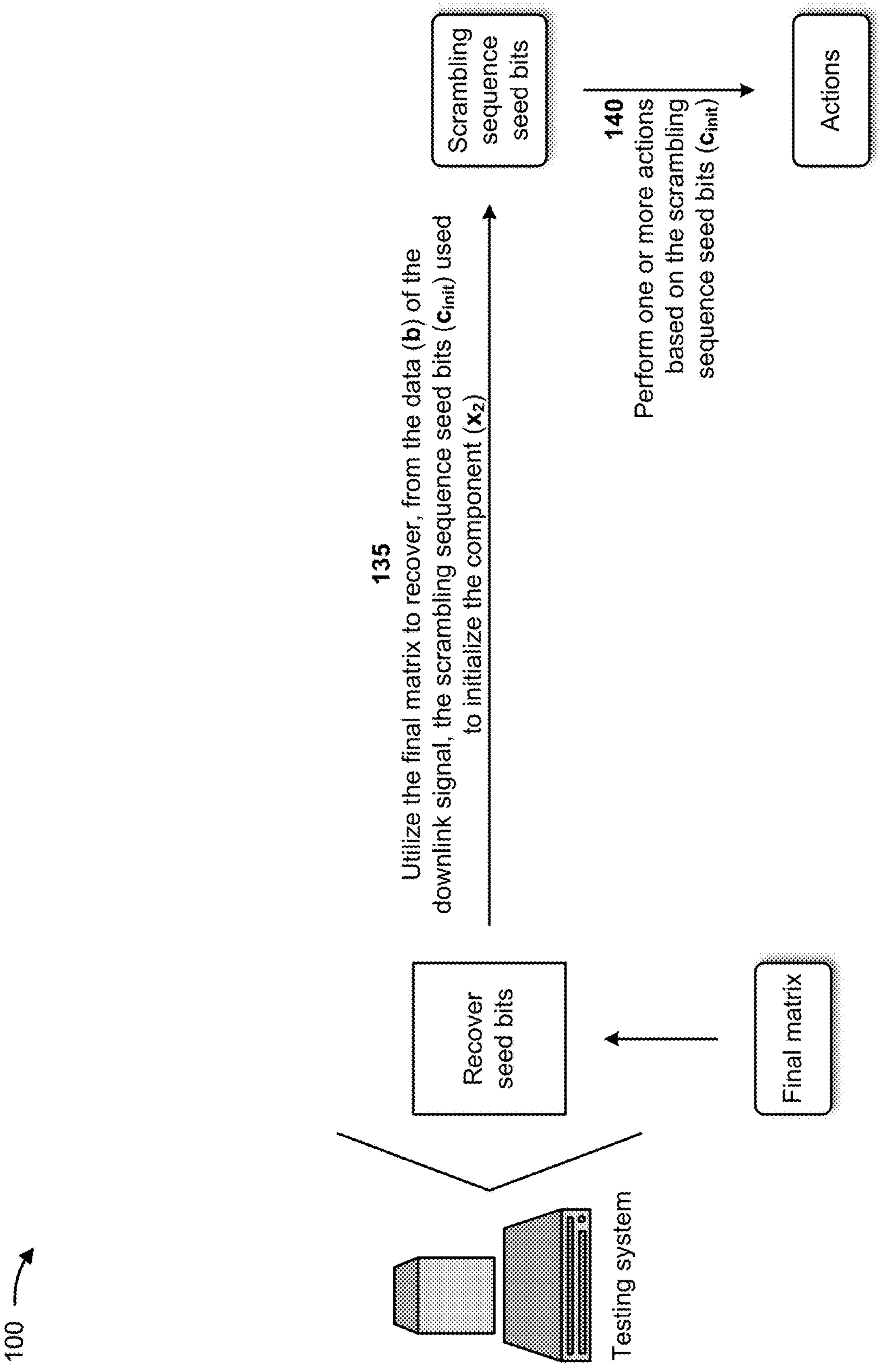

As shown in FIG. 1H, and by reference number 135, the testing system may utilize the final matrix to recover the scrambling sequence seed bits ($c_{init}$) used to initialize the component ($x_2$) from the data (b). For example, the testing system may utilize the final matrix to recover the scrambling sequence seed bits ($c_{init}$) used to initialize the component $x_2$ from the scrambled data b of the downlink signal (e.g., assuming $x_1$ is removed). When encoding is complete, the testing system may set the frozen bits to zero, and any impact of the frozen bits must therefore be due to the scrambling. Because the encoding of the data is orthogonal to the frozen bits, such a mapping may be the same irrespective of a data payload transmitted in the downlink signal.

As further shown in FIG. 1H, and by reference number 140, the testing system may perform one or more actions based on the scrambling sequence seed bits ($c_{init}$). For example, when performing the one or more actions based on the scrambling sequence seed bits ($c_{init}$), the testing system may decode the downlink signal based on the scrambling sequence seed bits ($c_{init}$). The testing system may utilize the decoded downlink signal to perform additional testing of the downlink signal and/or the base station. In some implementations, when performing the one or more actions based on the scrambling sequence seed bits ($c_{init}$), the testing system may perform the one or more actions based on the scrambling sequence seed bits ($c_{init}$) and without performing a descrambling operation.

In this way, the testing system recovers scrambling sequence initialization from frozen bits of an uncoded DCI vector, without performing a descrambling operation. For example, the testing system may determine a scrambling sequence initialization vector from specific bits of an uncoded DCI vector without performing descrambling operation and without using exhaustive search. The testing system may be utilized with a high SNR, where bit values at specific bit locations of the uncoded DCI vector without descrambling are known. This, in turn, conserves computing resources, networking resources, and/or the like that would otherwise have been consumed in performing unnecessary and computationally intensive decoding operations, performing an unnecessary descrambling operation, performing an exhaustive search for a scrambling sequence initialization vector, and/or the like.

As indicated above, FIGS. 1A-1H are provided as an example. Other examples may differ from what is described with regard to FIGS. 1A-1H. The number and arrangement of devices shown in FIGS. 1A-1H are provided as an example. In practice, there may be additional devices, fewer devices, different devices, or differently arranged devices than those shown in FIGS. 1A-1H. Furthermore, two or more devices shown in FIGS. 1A-1H may be implemented within a single device, or a single device shown in FIGS. 1A-1H may be implemented as multiple, distributed devices. Additionally, or alternatively, a set of devices (e.g., one or more devices) shown in FIGS. 1A-1H may perform one or more functions described as being performed by another set of devices shown in FIGS. 1A-1H.

Figure 2:
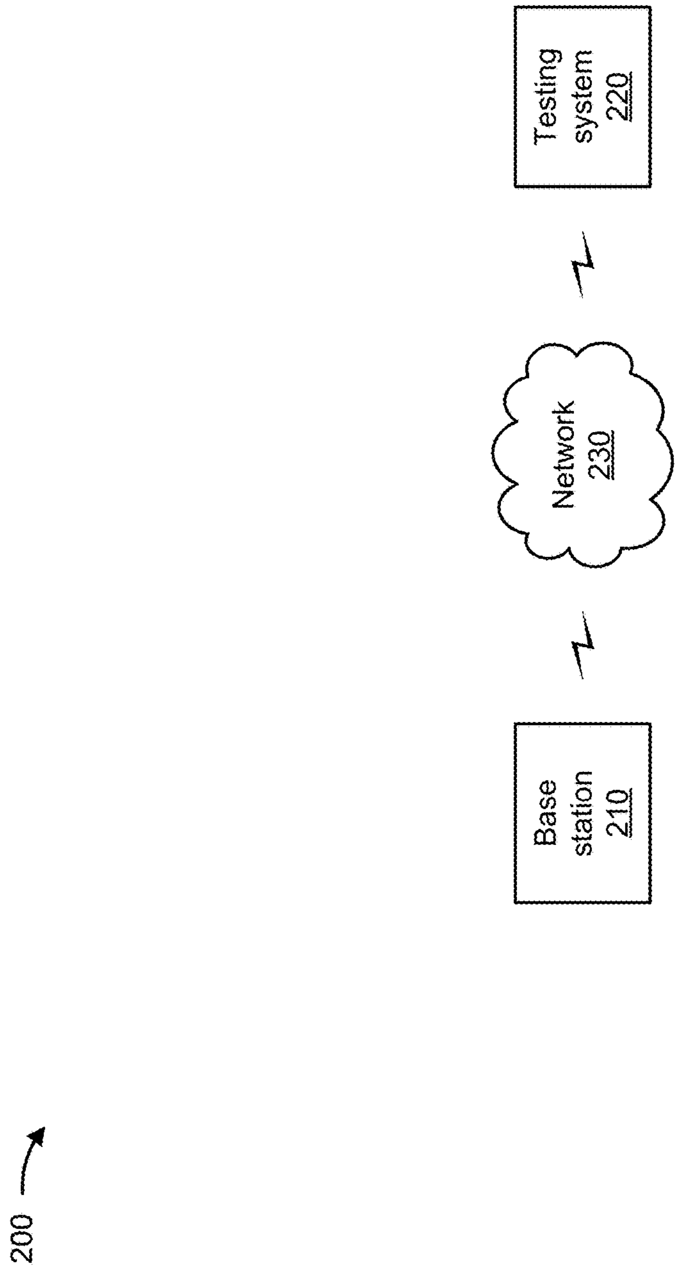
FIG. 2 is a diagram of an example environment in which systems and/or methods described herein may be implemented.

FIG. 2 is a diagram of an example environment 200 in which systems and/or methods described herein may be implemented. As shown in FIG. 2, the environment 200 may include a base station 210, a testing system 220, and/or a network 230. Devices and/or elements of the environment 200 may interconnect via wired connections and/or wireless connections.

The base station 210 may support, for example, a cellular radio access technology (RAT). The base station 210 may include one or more base stations (e.g., base transceiver stations, radio base stations, node Bs, eNodeBs (eNBs), gNodeBs (gNBs), base station subsystems, cellular sites, cellular towers, access points, transmit receive points (TRPs), radio access nodes, macrocell base stations, microcell base stations, picocell base stations, femtocell base stations, or similar types of devices) and other network entities that can support wireless communication for a UE. The base station 210 may transfer traffic between a UE (e.g., using a cellular RAT), one or more base stations (e.g., using a wireless interface or a backhaul interface, such as a wired backhaul interface), and/or a core network. The base station 210 may provide one or more cells that cover geographic areas.

In some implementations, the base station 210 may perform scheduling and/or resource management for a UE covered by the base station 210 (e.g., a UE covered by a cell provided by the base station 210). In some implementations, the base station 210 may be controlled or coordinated by a network controller, which may perform load balancing, network-level configuration, and/or other operations. The network controller may communicate with the base station 210 via a wireless or wireline backhaul. In some implementations, the base station 210 may include a network controller, a self-organizing network (SON) module or component, or a similar module or component. In other words, the base station 210 may perform network control, scheduling, and/or network management functions (e.g., for uplink, downlink, and/or sidelink communications of a UE covered by the base station 210).

The testing system 220 may include one or more devices capable of receiving, generating, storing, processing, and/or providing information, as described elsewhere herein. The testing system 220 may include a communication device and/or a computing device. For example, the testing system 220 may be utilized for functional testing, system integration testing, capacity testing, and stress testing of multiple cells (e.g., provided by the base stations 210), and may emulate thousands of UEs. In some implementations, the testing system 220 may emulate wireless communication devices, mobile phones, laptop computers, tablet computers, desktop computers, gaming consoles, set-top boxes, wearable communication devices (e.g., smart wristwatches, smart eyeglasses, head mounted displays, or virtual reality headsets), or similar types of devices.

The network 230 may include one or more wired and/or wireless networks. For example, the network 230 may include a cellular network (e.g., a fifth generation (5G) network, a fourth generation (4G) network, a long-term evolution (LTE) network, a third generation (3G) network, a code division multiple access (CDMA) network, etc.), a public land mobile network (PLMN), a local area network (LAN), a wide area network (WAN), a metropolitan area network (MAN), a telephone network (e.g., the Public Switched Telephone Network (PSTN)), a private network, an ad hoc network, an intranet, the Internet, a fiber optic-based network, and/or a combination of these or other types of networks. The network 230 enables communication among the devices of environment 200.

The number and arrangement of devices and networks shown in FIG. 2 are provided as an example. In practice, there may be additional devices and/or networks, fewer devices and/or networks, different devices and/or networks, or differently arranged devices and/or networks than those shown in FIG. 2. Furthermore, two or more devices shown in FIG. 2 may be implemented within a single device, or a single device shown in FIG. 2 may be implemented as multiple, distributed devices. Additionally, or alternatively, a set of devices (e.g., one or more devices) of the environment 200 may perform one or more functions described as being performed by another set of devices of the environment 200.

Figure 3:
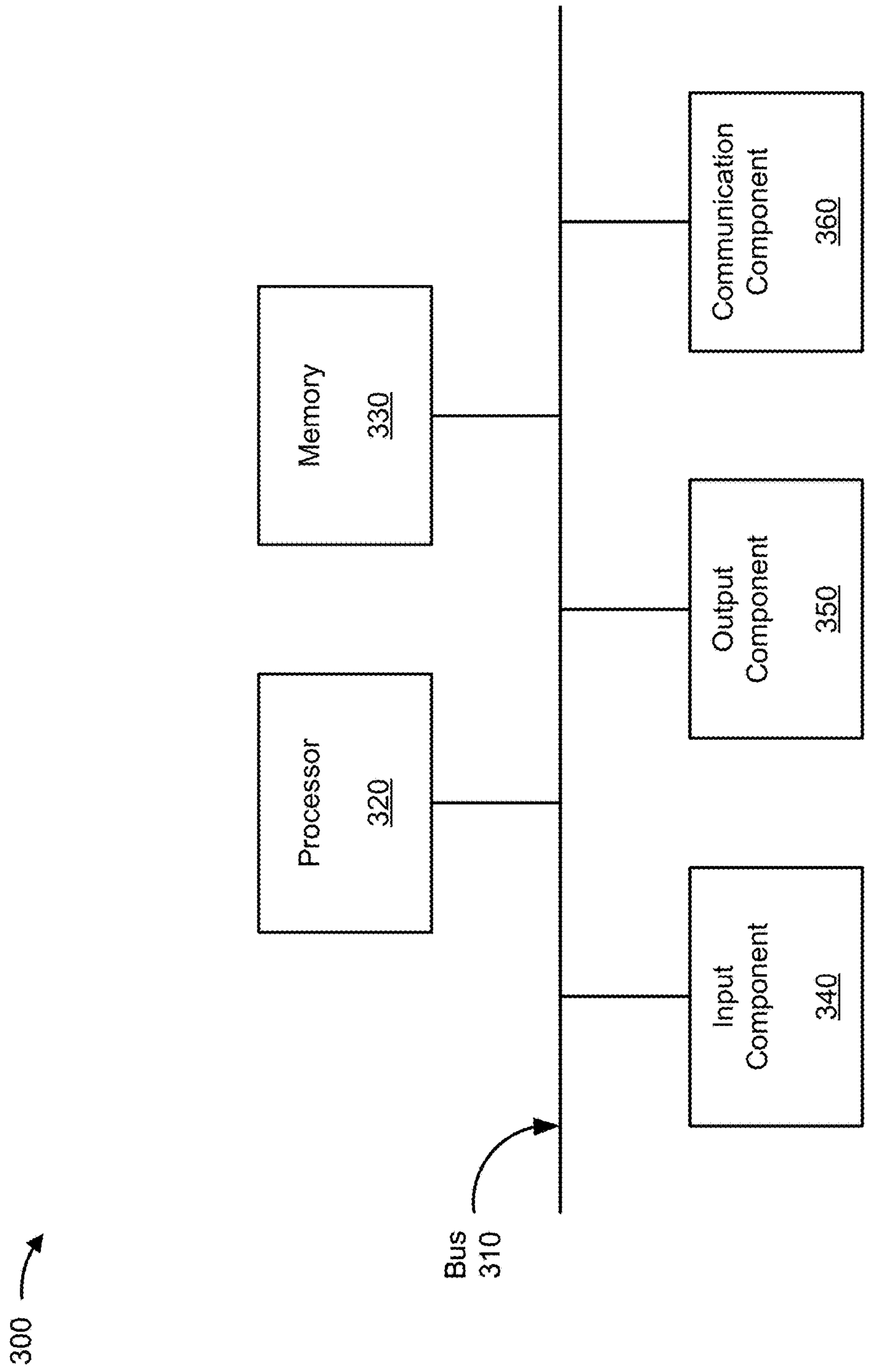
FIG. 3 is a diagram of example components of one or more devices of FIG. 2.

FIG. 3 is a diagram of example components of a device 300, which may correspond to the base station 210 and/or the testing system 220. In some implementations, the base station 210 and/or the testing system 220 may include one or more devices 300 and/or one or more components of the device 300. As shown in FIG. 3, the device 300 may include a bus 310, a processor 320, a memory 330, an input component 340, an output component 350, and a communication interface 360.

The bus 310 includes one or more components that enable wired and/or wireless communication among the components of the device 300. The bus 310 may couple together two or more components of FIG. 3, such as via operative coupling, communicative coupling, electronic coupling, and/or electric coupling. The processor 320 includes a central processing unit, a graphics processing unit, a microprocessor, a controller, a microcontroller, a digital signal processor, a field-programmable gate array, an application-specific integrated circuit, and/or another type of processing component. The processor 320 is implemented in hardware, firmware, or a combination of hardware and software. In some implementations, the processor 320 includes one or more processors capable of being programmed to perform one or more operations or processes described elsewhere herein.

The memory 330 includes volatile and/or nonvolatile memory. For example, the memory 330 may include random access memory (RAM), read only memory (ROM), a hard disk drive, and/or another type of memory (e.g., a flash memory, a magnetic memory, and/or an optical memory). The memory 330 may include internal memory (e.g., RAM, ROM, or a hard disk drive) and/or removable memory (e.g., removable via a universal serial bus connection). The memory 330 may be a non-transitory computer-readable medium. The memory 330 stores information, instructions, and/or software (e.g., one or more software applications) related to the operation of the device 300. In some implementations, the memory 330 includes one or more memories that are coupled to one or more processors (e.g., the processor 320), such as via the bus 310.

The input component 340 enables the device 300 to receive input, such as user input and/or sensed input. For example, the input component 340 may include a touch screen, a keyboard, a keypad, a mouse, a button, a microphone, a switch, a sensor, a global positioning system sensor, an accelerometer, a gyroscope, and/or an actuator. The output component 350 enables the device 300 to provide output, such as via a display, a speaker, and/or a light-emitting diode. The communication interface 360 enables the device 300 to communicate with other devices via a wired connection and/or a wireless connection. For example, the communication interface 360 may include a receiver, a transmitter, a transceiver, a modem, a network interface card, and/or an antenna.

The device 300 may perform one or more operations or processes described herein. For example, a non-transitory computer-readable medium (e.g., the memory 330) may store a set of instructions (e.g., one or more instructions or code) for execution by the processor 320. The processor 320 may execute the set of instructions to perform one or more operations or processes described herein. In some implementations, execution of the set of instructions, by one or more processors 320, causes the one or more processors 320 and/or the device 300 to perform one or more operations or processes described herein. In some implementations, hardwired circuitry may be used instead of or in combination with the instructions to perform one or more operations or processes described herein. Additionally, or alternatively, the processor 320 may be configured to perform one or more operations or processes described herein. Thus, implementations described herein are not limited to any specific combination of hardware circuitry and software.

The number and arrangement of components shown in FIG. 3 are provided as an example. The device 300 may include additional components, fewer components, different components, or differently arranged components than those shown in FIG. 3. Additionally, or alternatively, a set of components (e.g., one or more components) of the device 300 may perform one or more functions described as being performed by another set of components of the device 300.

Figure 4:
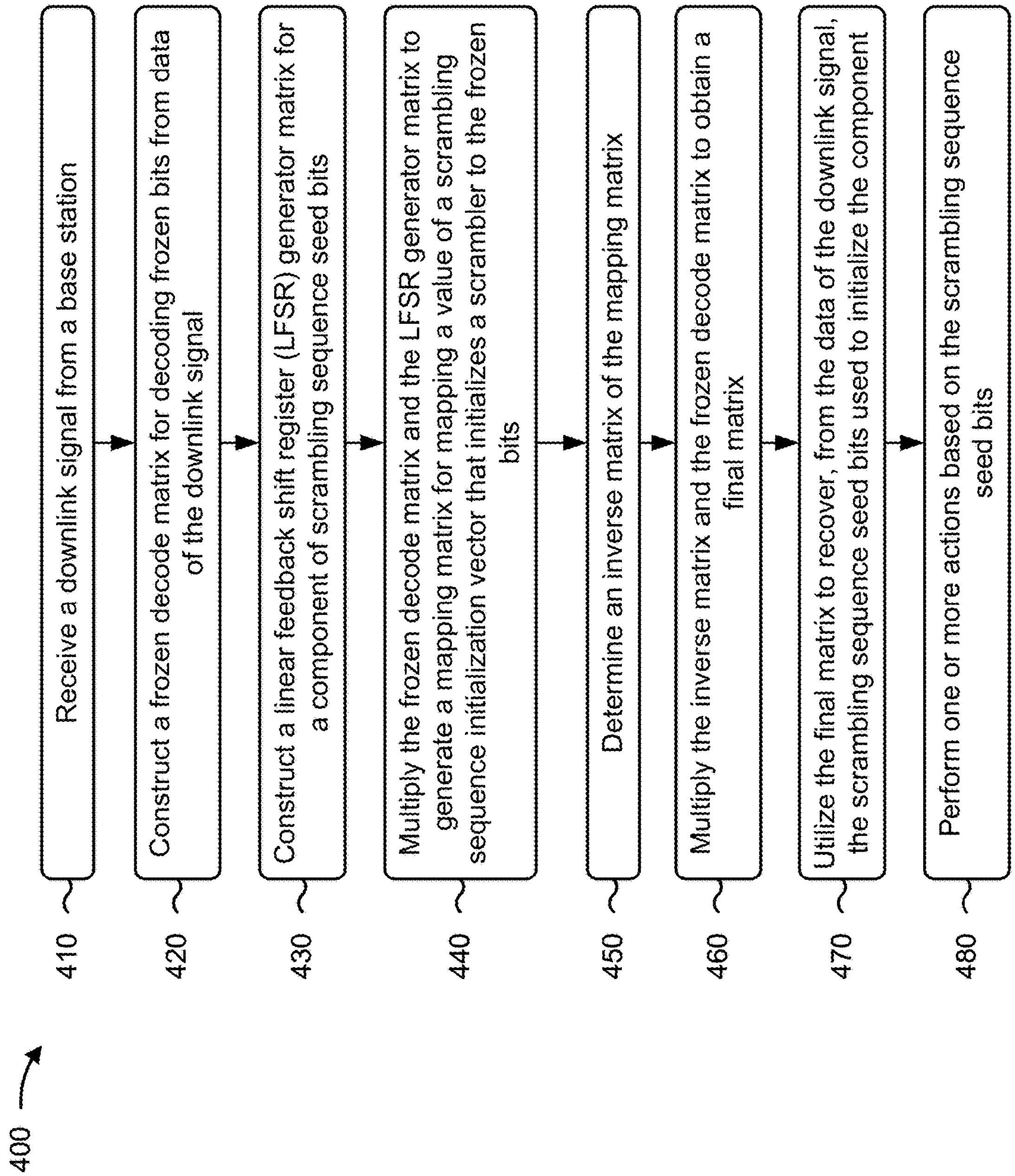
FIG. 4 is a flowchart of an example process for recovering scrambling sequence initialization from frozen bits of an uncoded downlink control information (DCI) vector.

FIG. 4 is a flowchart of an example process 400 for recovering scrambling sequence initialization from frozen bits of an uncoded DCI vector. In some implementations, one or more process blocks of FIG. 4 may be performed by a device (e.g., the testing system 220). In some implementations, one or more process blocks of FIG. 4 may be performed by another device or a group of devices separate from or including the device. Additionally, or alternatively, one or more process blocks of FIG. 4 may be performed by one or more components of the device 300, such as the processor 320, the memory 330, the input component 340, the output component 350, and/or the communication interface 360.

As shown in FIG. 4, process 400 may include receiving a downlink signal from a base station (block 410). For example, the device may receive a downlink signal from a base station, as described above. In some implementations, the downlink signal includes one of a physical broadcast channel signal, or a physical downlink control channel signal. In some implementations, the downlink signal includes an uncoded downlink control information vector. In some implementations, the downlink signal includes downlink control information. In some implementations, the downlink signal is a New Radio downlink control signal.

As further shown in FIG. 4, process 400 may include constructing a frozen decode matrix for decoding frozen bits from data of the downlink signal (block 420). For example, the device may construct a frozen decode matrix for decoding frozen bits from data of the downlink signal, as described above. In some implementations, constructing the frozen decode matrix for decoding the frozen bits from the data of the downlink signal includes determining an input-output relation of polar encoding based on the downlink signal, performing an interleaving operation with the input-output relation to obtain an interleaved vector, and utilizing rate matching with the interleaved vector to construct the frozen decode matrix.

In some implementations, determining the input-output relation of polar encoding based on the downlink signal includes multiplying the data of the downlink signal and a generator matrix to determine the input-output relation. In some implementations, performing the interleaving operation with the input-output relation to obtain the interleaved vector includes multiplying an interleave matrix and the input-output relation to obtain the interleaved vector. In some implementations, utilizing rate matching with the interleaved vector to construct the frozen decode matrix includes constructing the frozen decode matrix based on the interleaved vector and a variable that depends on a rate matching scheme.

As further shown in FIG. 4, process 400 may include constructing an LFSR generator matrix for a component of scrambling sequence seed bits (block 430). For example, the device may construct an LFSR generator matrix for a component of scrambling sequence seed bits, as described above. In some implementations, constructing the LFSR generator matrix for the component of the scrambling sequence seed bits includes generating a sequence generation operation, and generating a vector-matrix multiplication form of the sequence generation operation, wherein the vector-matrix multiplication form corresponds to the LFSR generator matrix.

As further shown in FIG. 4, process 400 may include multiplying the frozen decode matrix and the LFSR generator matrix to generate a mapping matrix for mapping a value of a scrambling sequence initialization vector that initializes a scrambler to the frozen bits (block 440). For example, the device may multiply the frozen decode matrix and the LFSR generator matrix to generate a mapping matrix for mapping a value of a scrambling sequence initialization vector that initializes a scrambler to the frozen bits, as described above.

As further shown in FIG. 4, process 400 may include determining an inverse matrix of the mapping matrix (block 450). For example, the device may determine an inverse matrix of the mapping matrix, as described above. In some implementations, determining the inverse matrix of the mapping matrix includes generating a transpose matrix of the mapping matrix, converting the transpose matrix and an identity matrix into a reduced echelon row form, and utilizing a portion of the reduced echelon row form to determine the inverse matrix.

As further shown in FIG. 4, process 400 may include multiplying the inverse matrix and the frozen decode matrix to obtain a final matrix (block 460). For example, the device may multiply the inverse matrix and the frozen decode matrix to obtain a final matrix, as described above.

As further shown in FIG. 4, process 400 may include utilizing the final matrix to recover, from the data of the downlink signal, the scrambling sequence seed bits used to initialize the component (block 470). For example, the device may utilize the final matrix to recover, from the data of the downlink signal, the scrambling sequence seed bits used to initialize the component, as described above.

As further shown in FIG. 4, process 400 may include performing one or more actions based on the scrambling sequence seed bits (block 480). For example, the device may perform one or more actions based on the scrambling sequence seed bits, as described above. In some implementations, performing the one or more actions based on the scrambling sequence seed bits includes decoding the downlink signal based on the scrambling sequence seed bits. In some implementations, performing the one or more actions based on the scrambling sequence seed bits includes performing the one or more actions based on the scrambling sequence seed bits and without performing a descrambling operation.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

The foregoing disclosure provides illustration and description but is not intended to be exhaustive or to limit the implementations to the precise form disclosed. Modifications may be made in light of the above disclosure or may be acquired from practice of the implementations.

As used herein, the term "component" is intended to be broadly construed as hardware, firmware, or a combination of hardware and software. It will be apparent that systems and/or methods described herein may be implemented in different forms of hardware, firmware, and/or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be used to implement the systems and/or methods based on the description herein.

As used herein, satisfying a threshold may, depending on the context, refer to a value being greater than the threshold, greater than or equal to the threshold, less than the threshold, less than or equal to the threshold, equal to the threshold, and/or the like, depending on the context.

Although particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article “the” and may be used interchangeably with “the one or more.” Furthermore, as used herein, the term “set” is intended to include one or more items (e.g., related items, unrelated items, a combination of related and unrelated items, and/or the like), and may be used interchangeably with “one or more.” Where only one item is intended, the phrase “only one” or similar language is used. Also, as used herein, the terms “has,” “have,” “having,” or the like are intended to be open-ended terms. Further, the phrase “based on” is intended to mean “based, at least in part, on” unless explicitly stated otherwise. Also, as used herein, the term “or” is intended to be inclusive when used in a series and may be used interchangeably with “and/or,” unless explicitly stated otherwise (e.g., if used in combination with “either” or “only one of”).

In the preceding specification, various example embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

What is claimed is:

1. A method, comprising:

receiving, by a device, a downlink signal from a base station;

generating, by the device, a mapping matrix for mapping a scrambling sequence initialization to frozen bits from data of the downlink signal;

determining, by the device, an inverse matrix of the mapping matrix;

obtaining, by the device and based on the inverse matrix and the frozen bits, a final matrix; and recovering, by the device and based on the final matrix, scrambling sequence seed bits to decode the downlink signal without performing a descrambling operation.

2. The method of claim 1, wherein the downlink signal comprises an uncoded downlink channel information (DCI) vector.

3. The method of claim 1, wherein the downlink signal includes a signal on a physical channel that carries downlink channel information (DCI).

4. The method of claim 1, further comprising:

constructing a first matrix associated with the frozen bits from data of the downlink signal; and constructing a second matrix associated with a component of the scrambling sequence seed bits, wherein the mapping matrix is based on the first matrix and the second matrix.

5. The method of claim 4, wherein constructing the first matrix comprises:

determining an input-output relation of polar encoding based on the downlink signal;

obtaining an interleaved vector based on the input-out relation; and constructing the first matrix based on rate matching with the interleaved vector.

6. The method of claim 4, wherein obtaining the final matrix comprises:

obtaining the final matrix based on the inverse matrix and the first matrix.

7. The method of claim 1, further comprising:

performing testing on at least one of the downlink signal or the base station.

8. A device, comprising:

one or more memories; and one or more processors, coupled to the one or more memories, configured to:

receive a downlink signal from a base station;

generate a mapping matrix for mapping a scrambling sequence initialization to frozen bits from data of the downlink signal;

determine an inverse matrix of the mapping matrix;

obtain, based on the inverse matrix and the frozen bits, a final matrix; and recover, based on the final matrix, scrambling sequence seed bits to decode the downlink signal without performing a descrambling operation.

9. The device of claim 8, wherein the downlink signal comprises an uncoded downlink channel information (DCI) vector.

10. The device of claim 8, wherein the downlink signal includes a signal on a physical channel that carries downlink channel information (DCI).

11. The device of claim 8, wherein the one or more processors are further configured to:

construct a first matrix associated with the frozen bits from data of the downlink signal; and construct a second matrix associated with a component of the scrambling sequence seed bits, wherein the mapping matrix is based on the first matrix and the second matrix.

12. The device of claim 11, wherein the one or more processors, to construct the first matrix, are configured to:

determine an input-output relation of polar encoding based on the downlink signal;

obtain an interleaved vector based on the input-out relation; and construct the first matrix based on rate matching with the interleaved vector.

13. The device of claim 11, wherein the one or more processors, to obtain the final matrix, are configured to:

obtain the final matrix based on the inverse matrix and the first matrix.

14. The device of claim 8, wherein the one or more processors are further configured to:

perform testing on at least one of the downlink signal or the base station.

15. A non-transitory computer-readable medium storing a set of instructions, the set of instructions comprising:

one or more instructions that, when executed by one or more processors of a device, cause the device to:

receive a downlink signal from a base station;

generate a mapping matrix for mapping a scrambling sequence initialization to frozen bits from data of the downlink signal;

determine an inverse matrix of the mapping matrix;

obtain, based on the inverse matrix and the frozen bits, a final matrix; and recover, based on the final matrix, scrambling sequence seed bits to recover the downlink signal without performing a descrambling operation.

16. The non-transitory computer-readable medium of claim 15, wherein the downlink signal comprises an uncoded downlink channel information (DCI) vector.

17. The non-transitory computer-readable medium of claim 15, wherein the downlink signal includes a signal on a physical channel that carries downlink channel information (DCI).

18. The non-transitory computer-readable medium of claim 15, wherein the one or more instructions further cause the device to:

construct a first matrix associated with the frozen bits from data of the downlink signal; and construct a second matrix associated with a component of scrambling sequence seed bits, wherein the mapping matrix is based on the first matrix and the second matrix.

19. The non-transitory computer-readable medium of claim 18, wherein the one or more instructions, that cause the device to construct the first matrix, cause the device to:

determine an input-output relation of polar encoding based on the downlink signal;

obtain an interleaved vector based on the input-out relation; and construct the first matrix based on rate matching with the interleaved vector.

20. The non-transitory computer-readable medium of claim 18, wherein the one or more instructions, that cause the device to obtain the final matrix, cause the device to:

obtain the final matrix based on the inverse matrix and the first matrix.

* * * * *